United States Patent

Barrow

[11] Patent Number: 5,801,450
[45] Date of Patent: Sep. 1, 1998

[54] VARIABLE PITCH STAGGER DIE FOR OPTIMAL DENSITY

[75] Inventor: Michael Barrow, El Dorado Hills, Calif.

[73] Assignee: Intel Corporation, Santa Clara, Calif.

[21] Appl. No.: 733,518

[22] Filed: Oct. 18, 1996

[51] Int. Cl.$^6$ .................................................. H01L 23/48
[52] U.S. Cl. .......................... 257/784; 257/786; 438/612
[58] Field of Search .................................. 257/666, 686, 257/786, 784; 438/612

[56] References Cited

U.S. PATENT DOCUMENTS 4,875,138  10/1989  Cusack .................................. 257/786

FOREIGN PATENT DOCUMENTS 6-53266  2/1994  Japan .................................... 257/786

*Primary Examiner*—Tom Thomas
*Assistant Examiner*—Roy Potter
*Attorney, Agent, or Firm*—Blakely, Sokoloff, Taylor & Zafman

[57] ABSTRACT

A bond pad layout for an integrated circuit die. The integrated circuit has four opposing sides that intersect at four corners of the die. The top surface of the integrated circuit has a plurality of bond pads that extend along each side of the die. The bond pads are typically coupled to corresponding bond fingers of an integrated circuit package by bond wires. The spacing pitch of the bond pads in the center portions of the die are smaller than the bond pad pitch at the corners of the die. The larger bond pad pitch at the corners of the die compensate for fanout of the bond wires. The smaller bond pad pitch in the center portions of the die optimizes the number of bond pads that can be formed on the integrated circuit. The bond pad layout thus optimizes the number of bond pads while compensating for the fanout of the bond wires.

7 Claims, 1 Drawing Sheet

VARIABLE PITCH STAGGER DIE FOR OPTIMAL DENSITY

BACKGROUND OF THE INVENTION

1. Field of the Invention

The present invention relates to a bond pad layout for an integrated circuit die.

2. Description of Related Art

Integrated circuits are assembled into packages that are mounted to printed circuit boards. The integrated circuit packages may have internal bond fingers that are coupled to corresponding bond pads of an integrated circuit die that is mounted to the package. The package contains internal routing that connect the bond fingers and die to external contacts that are soldered to the printed circuit board.

FIG. 1 shows a conventional bond pad layout for an integrated circuit 1. The bond pads 2 are arranged into two staggerred rows that have a uniform spacing pitch across each side of the die 1. Each bond pad 2 is connected to a corresponding bond finger (not shown) of the package by a bond wire 3. The bond fingers extend across an area that is longer than the area encompassing the bond pads 2. The larger bond finger area requires a "fanout" of bond wires 3 that connect the bond fingers to the bond pads 2 located at the corners of the die 1. The fanout of bond wires 3 create a sweep angle that limits the minimum spacing between adjacent bond pads 2 of the die. It is generally desirable to decrease the bond pad spacing, to increase the number of pads and the throughput of the device, or maintain the number of bond pads and decrease the size of the die. It would be desirable to provide a bond pad layout which optimizes the bond pads of an integrated circuit die.

SUMMARY OF THE INVENTION

The present invention is a bond pad layout for an integrated circuit die. The integrated circuit has four opposing sides that intersect at four corners of the die. The top surface of the integrated circuit has a plurality of bond pads that extend along each side of the die. The bond pads are typically coupled to corresponding bond fingers of an integrated circuit package by bond wires. The spacing pitch of the bond pads in the center portions of the die are smaller than the bond pad pitch at the corners of the die. The larger bond pad pitch at the corners of the die compensate for fanout of the bond wires. The smaller bond pad pitch in the center portions of the die optimizes the number of bond pads that can be formed on the integrated circuit. The bond pad layout thus optimizes the number of bond pads while compensating for the fanout of the bond wires.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
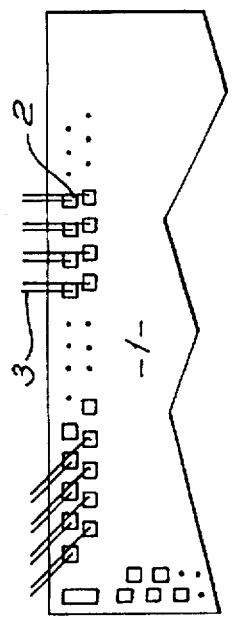
FIG. 1 is a top view showing a bond pad layout of the prior art.
Figure 2:
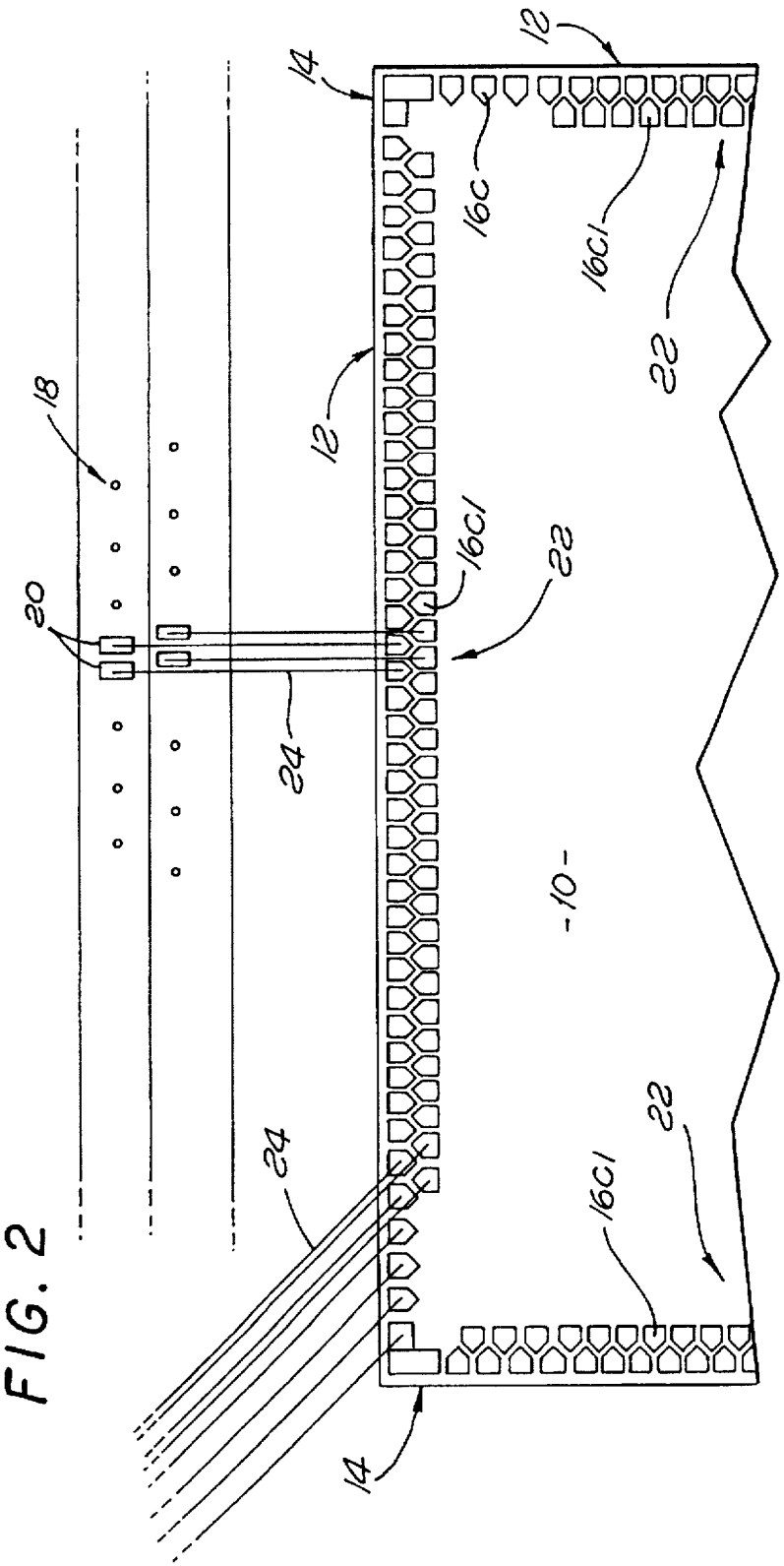
FIG. 2 is a top view showing a bond pad layout of the present invention.

Referring to the drawings more particularly by reference numbers, FIG. 2 shows a bond pad layout of the present invention. The bond pad layout provides variable spacing pitches to optimize the number of bond pads while compensating for bond wire fanout.

The bond pad layout is typically provided on an integrated circuit die 10 which has a plurality of opposing sides 12 that intersect at four different corners 14 of the die 10. The integrated circuit 10 may be a microprocessor. Extending along each side 12 of the die 10 are a plurality of bond pads 16. The bond pads 16 provide input/output terminals for the circuit(s) of the die 10.

The integrated circuit 10 is typically mounted to a substrate 18 of an integrated circuit package. The substrate 18 has a plurality of bond fingers 20 that extend around the periphery of the die 10. The bond fingers 20 are typically located on different bond shelves of the package. The substrate 18 typically contains internal routing which connect the bond fingers 20 to external contacts (not shown) of the integrated circuit package. The external contacts are typically soldered to a printed circuit board (not shown).

The bond pads 16 are arranged into first sets of bond pads 16c1 that are located at center portions 22 of each die side, and second sets of bond pads 16c that are located at the corners 14 of the die 10. The bond pads 16 may also be arranged into two separate rows that extend along the sides of the die 10.

The spacing or pitch, between adjacent bond pads of the first set of bond pads 16c1 is smaller than the spacing between adjacent bond pads of the second set of bond pads 16c. By way of example, the pitch between adjacent bond pads of the same row in the first set 16c1 may be 140 microns, while the pitch between adjacent bond pads of the same row in the second set 16c may be 150 microns.

The bond pads 16 are typically coupled to the bond fingers 20 by a plurality of bond wires 24. The bond wires 24 are typically assembled with an automated bonding machine. Although bond wires 24 are shown and described, it is to be understood that the bond pads 16 may be coupled to the bond fingers 20 by other means such as tape automated bonding (TAB tape).

Because the bond fingers 20 extend beyond the sides of the die 10, the bond wires 24 located at the die corners 14 must be assembled at a sweep angle relative to the sides of the integrated circuit 10. The bond wires 24 at or near the center portions 22 have minimal sweep angles. For this reason the first set of bond pads 16c1 may have a smaller pitch than the bond pads 16c located at the corners of the die 10. The layout of the present invention thus optimizes the number of bond pads 16, while allowing the pads 16c in the corners 14 of the die 10 to be connected to corresponding bond fingers 20 located at the corners of the substrate 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit, comprising:
    a die which has a plurality of sides that each have a center portion and intersect at a plurality of corners of said die, each side of said die includes a plurality of bond pads that include a first set of bond pads that are located at said center portion and which contains bond pads that have a first spacing pitch, said first set of bond pads being arranged into two rows and two second sets of bond pads that are located at two corners of said die and which each contain bond pads that have a second spacing pitch.

2. The integrated circuit as recited in claim 1, wherein said second spacing pitch is greater than said first spacing pitch.

3. An integrated circuit package, comprising:

a substrate which has a plurality of bond fingers; and, a die which has a plurality of sides that each have a center portion and intersect at a plurality of corners of said die, each side of said die includes a plurality of bond pads that are coupled to said bond fingers and include a first set of bond pads that are located at said center portion and which contains bond pads that have a first spacing pitch, said first set of bond pads being arranged into two rows and two second sets of bond pads that are located at two corners of said die and which each contain bond pads that have a second spacing pitch.

4. The package as recited in claim 3, wherein said second spacing pitch is greater than said first spacing pitch.

5. The package as recited in claim 4, further comprising a plurality of bond wires that couple said bond fingers to said bond pads.

6. A method for assembling an integrated circuit package, comprising the steps of:

a) providing a substrate which has a plurality of bond fingers;

b) mounting a die to said substrate, wherein said die has a plurality of bond pads that include a first set of bond pads that are located at a center portion of said die and which contains bond pads that have a first spacing pitch, said first set of bond pads being arranged into two rows and two second sets of bond pads that are located at two corners of said die and which each contain bond pads that have a second spacing pitch; and, c) coupling said bond fingers to said bond pads.

7. The method as recited in claim 6, wherein said bond fingers are coupled to said bond pads by a plurality of bond wires.

* * * * *